(12) United States Patent
Otremba et al.

(10) Patent No.: US 7,514,778 B2
(45) Date of Patent: Apr. 7, 2009

(54) POWER SEMICONDUCTOR DEVICE

(75) Inventors: Ralf Otremba, Kaufbeuren (DE); Khalil Hosseini, Weihmichl (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/235,474

(22) Filed: Sep. 26, 2005

(65) Prior Publication Data

US 2006/0118815 A1 Jun. 8, 2006

(30) Foreign Application Priority Data

Sep. 29, 2004 (DE) ..................... 10 2004 047 306

(51) Int. Cl.
 *H01L 31/111* (2006.01)
(52) U.S. Cl. ................ 257/691; 257/177; 257/E23.079
(58) Field of Classification Search ................ 257/691, 257/177, E23.001–E23.194
See application file for complete search history.

(56) References Cited

U.S. PATENT DOCUMENTS

| | | | |
|---|---|---|---|
| 4,128,802 A * | 12/1978 | Gansert et al. | ................ 322/28 |
| 5,814,884 A | 9/1998 | Davis et al. | |
| 6,144,093 A * | 11/2000 | Davis et al. | ................ 257/723 |
| 6,307,272 B1 * | 10/2001 | Takahashi et al. | ........... 257/787 |
| 6,380,635 B1 * | 4/2002 | Manning et al. | ............ 257/784 |
| 2002/0089070 A1 | 7/2002 | Manning et al. | |
| 2004/0145034 A1 * | 7/2004 | Fujioka et al. | .............. 257/664 |

FOREIGN PATENT DOCUMENTS

| | | |
|---|---|---|
| EP | 0265927 | 5/1988 |
| JP | 01048438 | 2/1989 |
| JP | 10125710 | 5/1998 |

* cited by examiner

*Primary Examiner*—Leonardo Andújar
(74) *Attorney, Agent, or Firm*—Dicke, Billig & Czaja, PLLC

(57) ABSTRACT

A power semiconductor device is disclosed. In one embodiment, the power semiconductor device includes a plurality of device components that are contact-connected by bonding wires having different thicknesses. The surface of at least one bonding wire serves as a contact area for at least one further bonding wire, the bonding wire that serves as contact area being thicker than the bonding wire contact-connected thereon.

14 Claims, 3 Drawing Sheets

POWER SEMICONDUCTOR DEVICE

CROSS-REFERENCE TO RELATED APPLICATIONS

This Utility Patent Application claims priority to German Patent Application No. DE 10 2004 047 306.4, filed on Sep. 29, 2004, which is incorporated herein by reference.

FIELD OF THE INVENTION

The invention relates to a power semiconductor device.

BACKGROUND

Power semiconductor devices may have not only power components but also control components which serve for controlling the power components. Since the current intensities of the electric currents that permeate the power components are significantly higher than the intensities of the electric currents that are fed to the control components, the thicknesses of power bonding wires that make contact with the power components turn out to be very different compared with the thicknesses of the control bonding wires that make contact with the control components.

The wiring of power components and control components is relatively complicated since for each bonding wire it is necessary to provide contact areas on the power components and control components, respectively, the lateral space requirement of the contact areas turning out to be different depending on the type of bonding wire (power bonding wire or control bonding wire).

FIG. 1 illustrates a schematic plan view of a known power semiconductor device.

A power semiconductor device 1 has a first power component 2, a second power component 3 and also a control component 4 for controlling the first and second power components 2, 3. The first and second power components 2, 3 are arranged next to one another, and the control component 4 is provided on the second power component 3. A power contact area 5 and also control contact areas 6, 7 are provided on the first power component 2. A power contact area 8 and also control contact areas 9, 10 are likewise provided on the second power component 3. Control contact areas 11 to 20 are provided on the control component 4. The control contact areas 6, 7, 9 and 10 provided on the first and second power components 2, 3 are electrically connected via control bonding wires $21_1$, $21_2$, $21_3$, $21_4$ to the control contact areas 13, 14, 11, 14 provided on the control component 4. Furthermore, the control contact areas 15 to 20 provided on the control component 4 are electrically connected to external connections 22 of the power semiconductor device 1 via control bonding wires $21_5$ to $21_{10}$. The power contact areas 6 and 8 are in each case electrically contact-connected by means of a power bonding wire 23, 24, each power bonding wire 23, 24 in turn being electrically connected to an external connection 22.

What is disadvantageous about the power semiconductor device 1 described in FIG. 1 is that the power contact areas 5, 8 and the control contact areas 6, 7, 9 and 10 in their totality take up a relatively large amount of space, so that, given a predetermined lateral extent of the power components 2 and 3, the active zones provided within the power components 2, 3 generally turn out to be smaller, the higher the lateral extent of the power contact areas 5 and 8. This leads either to an increased lateral extent of the power components 2, 3 (with the power of the power components remaining the same), or to a lower power of the power components 2, 3 (with the lateral dimensions remaining the same). For these and other reasons there is a need for the present invention.

SUMMARY

The present invention provides a power semiconductor device. In one embodiment, the power semiconductor device includes having a plurality of device components that are contact-connected by bonding wires having different thicknesses. The surface of at least one bonding wire serves as a contact area for at least one further bonding wire, the bonding wire that serves as contact area being thicker than the bonding wire contact-connected thereon.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

In the figures, identical or mutually corresponding regions, structural parts or structural part groups are identified by the same reference numerals.

DETAILED DESCRIPTION

Figure 1:
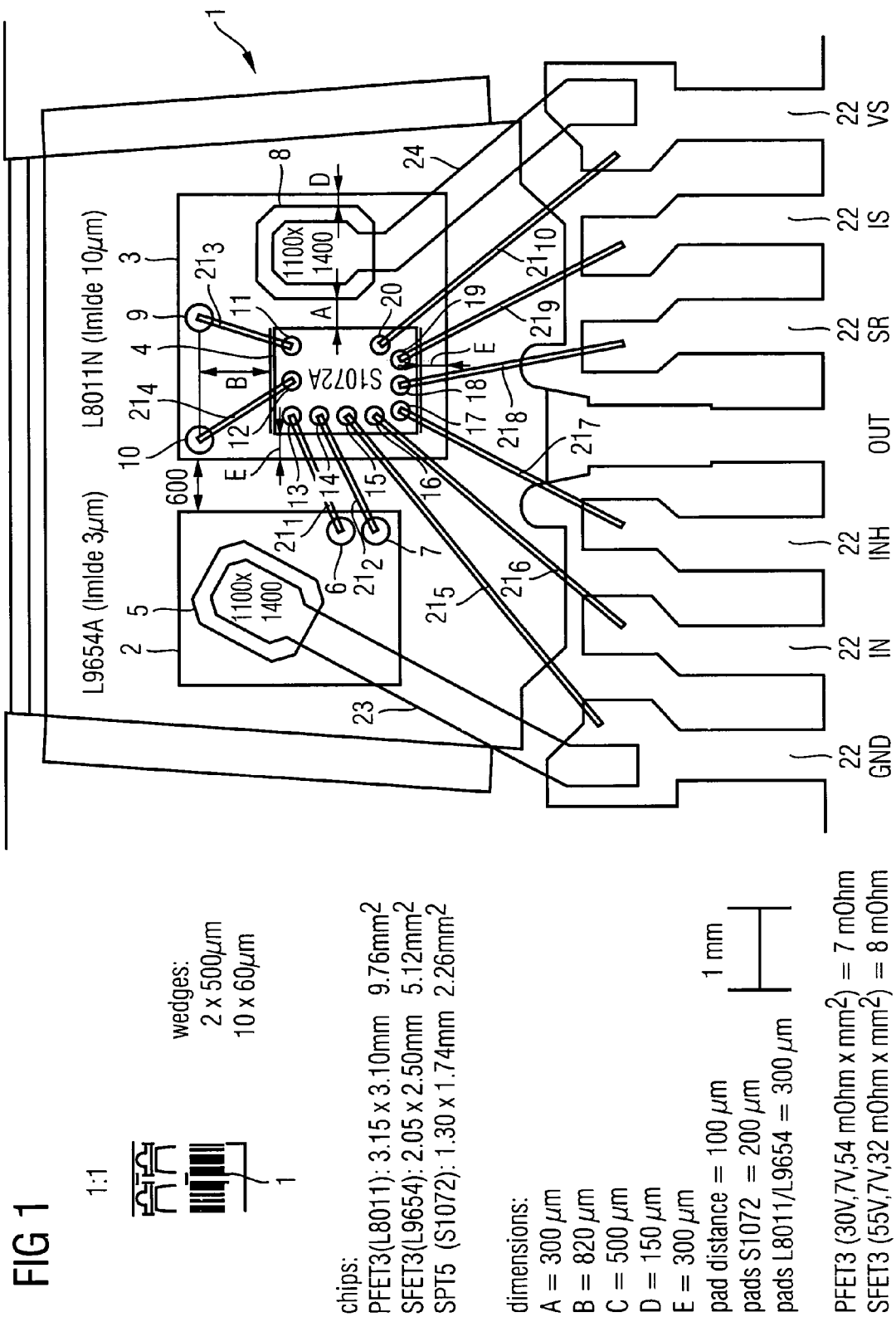
FIG. 1 illustrates a schematic plan view of a known power semiconductor device.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides a power semiconductor device which has a reduced lateral space requirement, without having to accept restrictions in the power properties of the semiconductor device.

In one embodiment, the power semiconductor device according to the invention includes a plurality of device components that are contact-connected by bonding wires having different thicknesses. The surface of at least one bonding wire serves as a contact area for at least one further bonding wire, the bonding wire that serves as contact area being thicker than the bonding wire contact-connected thereon.

The bonding of thinner bonding wires onto thicker bonding wires ensures that the upper bonding wires bearing on the surface of a lower bonding wire do not extend beyond the contact area of the lower bonding wire ("wedge pad") with the concomitant risk of short circuits.

In one embodiment, the power semiconductor device has at least one power component, and at least one control component for controlling the power components. The power components are contact-connected by power bonding wires, and the control components are contact-connected by control bonding wires. The surface of at least one power bonding wire serves as contact area for a control bonding wire and/or a further power bonding wire.

According to one embodiment of the invention, then, the surfaces of the power bonding wires are used differently from their intended purpose as contact areas for the control bonding wires and/or for other power bonding wires. The surface of a power bonding wire may be used as contact area for the contact-connection of a control bonding wire/a further power bonding wire particularly when the power contact area serving for the contact-connection of the power bonding wire is intended to be at the same potential as the control contact area for the contact-connection of the control bonding wire and/or at the same potential as the power contact area for the contact-connection of the further power bonding wire. If the surface of a power bonding wire is used for the contact-connection of a further power bonding wire, then the thickness of the power bonding wire whose surface is utilized as contact area turns out to be greater than the thickness of the other power bonding wire.

The diameter of the power bonding wires preferably lies in a range of 350 µm to 500 µm. The diameter of the control bonding wires is typically approximately 50 µm. However, the invention is not restricted to these values.

In one embodiment, the thicker bonding wire serving as contact area is contact-connected by the thinner bonding wire within a bonding wire region bearing on the device component that is contact-connected by the thicker bonding wire. This is expedient in terms of production engineering since a non-negligible mechanical stability of the thicker bonding wire is necessary for bonding the thinner bonding wire onto the thicker bonding wire. This mechanical stability is provided in particular in the bonding wire sections that bear on device components. Such contacts are also referred to as "wedge" contacts.

The power components may be for example power MOSFET (metal oxide semiconductor field-effect transistor) chips, and the control components may be control chips.

FIG. 1 illustrates a schematic plan view of a known power semiconductor device.

A power semiconductor device 1 has a first power component 2, a second power component 3 and also a control component 4 for controlling the first and second power components 2, 3. The first and second power components 2, 3 are arranged next to one another, and the control component 4 is provided on the second power component 3. A power contact area 5 and also a control contact area 7 are provided on the first power component 2. A power contact area 8 and also a control contact area 10 are likewise provided on the second power component 3. Control contact areas 11 to 20 are provided on the control component 4. The control contact areas 7 and 10 provided on the first and second power components 2, 3 are electrically connected via control bonding wires $21_1$, $21_4$ to the control contact areas 13, 14 provided on the control component 4. Furthermore, the control contact areas 15 to 20 provided on the control component 4 are electrically connected to external connections 22 of the power semiconductor device 1 via control bonding wires $21_5$ to $21_{10}$. The power contact areas 6 and 8 are in each case electrically contact-connected by means of a power bonding wire 23, 24, each power bonding wire 23, 24 in turn being electrically connected to an external connection 22.

Figure 2:
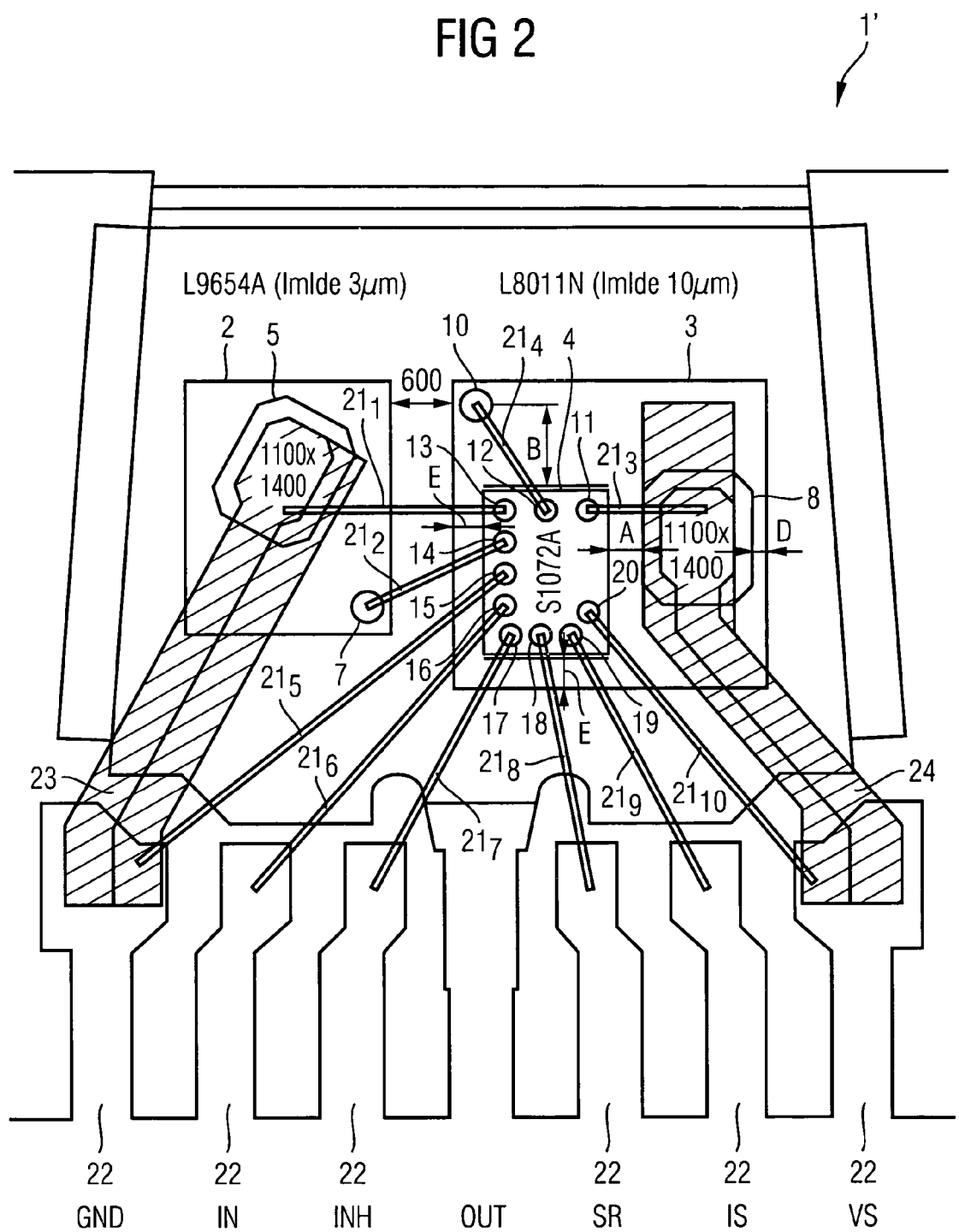
FIG. 2 illustrates a schematic plan view of a first embodiment of a power semiconductor device according to the invention.

The power semiconductor device 1' illustrated in FIG. 2 differs from the power semiconductor device 1 illustrated in FIG. 1. The control contact area 6 provided on the first power component 2 is omitted, and the corresponding control bonding wire $21_1$, which makes contact with the control contact area 13 provided on the control component 4, is directly connected to the surface of the power bonding wire 23. Furthermore, the control contact area 9 provided on the second power component 3 is omitted, and the corresponding control bonding wire $21_3$, which makes contact with the control contact area 11 provided on the control component 4, is directly connected to the surface of the power bonding wire 24. Furthermore, the power bonding wires 23, 24 in the power semiconductor device 1' are configured in thickened fashion compared with the power bonding wires 23, 24 of the power semiconductor device 1. The control bonding wires $21_1$ and $21_3$ tap off the potential prevailing at the power contact areas 5 and 8, that is to say that the control contact areas 13, 11 are at the same potential as the power contact areas 5, 8. The thicker power bonding wire 23 serving as contact area is contact-connected by the thinner control bonding wire $21_1$ within a bonding wire region bearing on the power component 2 that is contact-connected by the power bonding wire 23. This is expedient in terms of production engineering since a non-negligible mechanical stability of a thicker bonding wire is necessary for bonding a thinner bonding wire onto the thicker bonding wire. This mechanical stability with regard to the power bonding wire 23 is provided in particular in the bonding wire sections that bear on the power contact area 5. The same applies analogously to the power bonding wire 24.

The thickened configuration of the power bonding wires 23, 24 makes it possible to apply more intense electric currents to the power components 2, 3, whereby the power of the power semiconductor device can be increased with the dimensions remaining the same. If the control contact areas 6 and 9 were present, it would not be possible to widen the power bonding wires 23, 24 since a minimum distance between the power bonding wires 23, 24 and the control contact areas 6, 9 would no longer be ensured on account of manufacturing tolerances. By utilizing the surface of the power bonding wires 23, 24 as contact area for the control bonding wires $21_1$ and $21_3$, it is thus possible to increase the power of the semiconductor device with the dimensions remaining the same (thicker power bonding wires and larger active zone (of semiconductor bodies that can be permeated by electric currents) possible).

The power semiconductor devices 1, 1' furthermore differ in that the ends—remote from the control component 4—of the control bonding wires $21_5$, $21_{10}$ which make contact with the control contact areas 15, 20 bear directly on the ends of the power bonding wires 23, 24 which are remote from the power components 2, 3. What is advantageous in this case is that the entire (limited) contact area of the corresponding external connections 22 can be utilized for the power bonding wires 23, 24 in this way. This means that the power bonding wires 23, 24 can be made thicker and, consequently, higher electric currents can flow.

Figure 3:
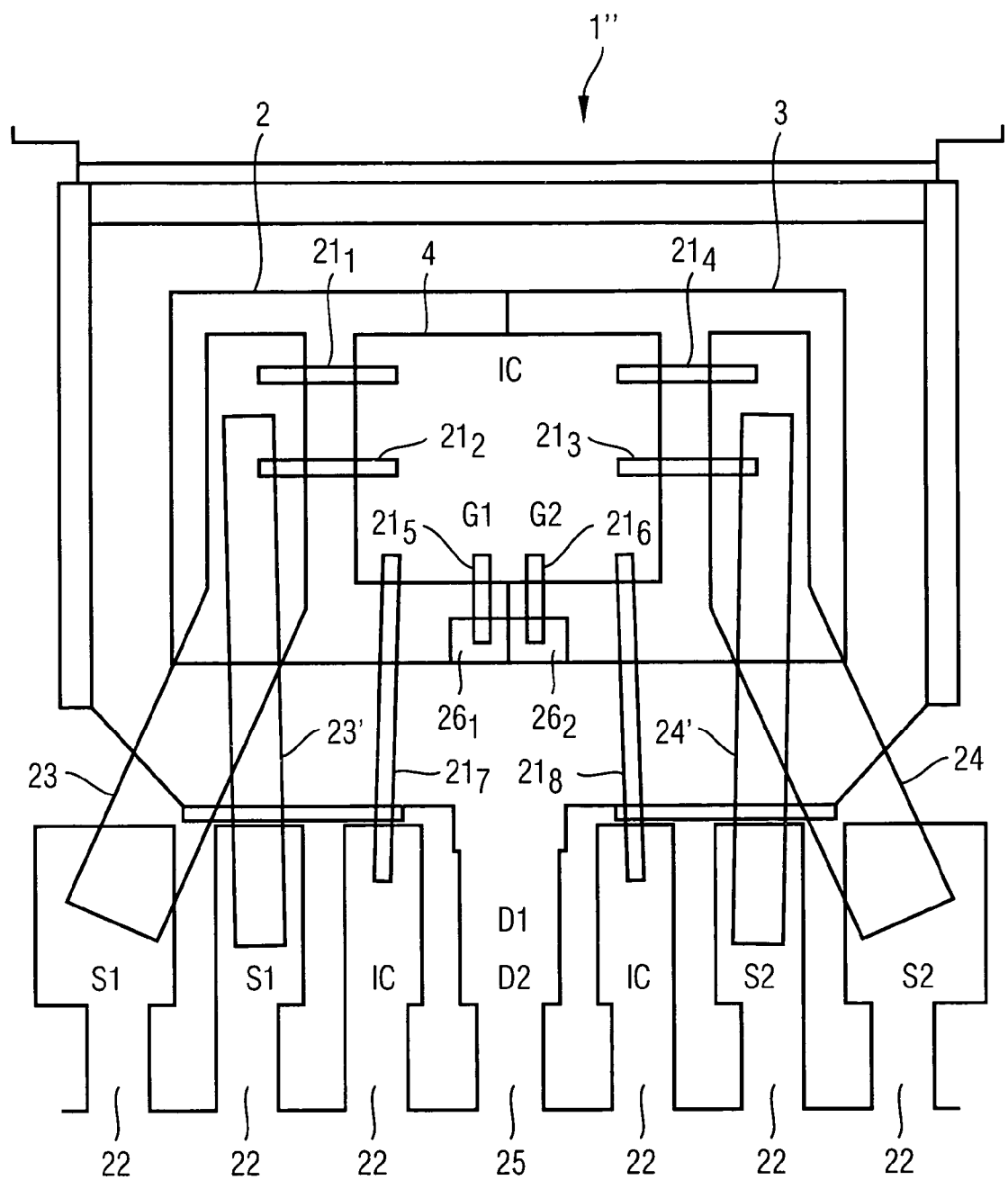
FIG. 3 illustrates a schematic plan view of a second embodiment of a power semiconductor device according to the invention.

FIG. 3 illustrates a further embodiment of a power semiconductor device 1" according to the invention.

The power semiconductor device 1" has a first power component 2, a second power component 3 (in each case a power MOSFET) and also a control component 4. The first power component 2 is contact-connected by a first and a second power bonding wire 23, 23', and the second power component 3 is contact-connected by a first and second power bonding wire 24, 24'. In this case, the power bonding wire 23' makes contact with the surface of the power bonding wire 23. The power bonding wire 24' analogously makes contact with the surface of the power bonding wire 24. The power bonding wires 23, 23', 24 and 24' each make contact with a separate external connection 22. In this embodiment, the power bonding wires 23, 23' make contact with a source region of the first power component 2 (MOSFET), whereas the power bonding wires 24, 24' make contact with a source region of the second power component 3 (MOSFET). The drain regions of the two power components 2, 3 are contact-connected via an external connection 25 (the external connection 25 is part of a leadframe on which the power components 2, 3 bear).

The control component 4 provided on the power components 2, 3 is electrically connected via a control bonding wire $21_1$ to the surface of the power bonding wire 23, via a control bonding wire $21_2$ to the surface of the power bonding wire 23' applied on the power bonding wire 23, via a control bonding wire $21_3$ to the surface of the power bonding wire 24, and via a control bonding wire $21_4$ to the surface of the power bonding wire 24' applied on the power bonding wire 24. Furthermore, the control component 4 is electrically connected via control bonding wires $21_5$, $21_6$ to gate contact areas $26_1$, $26_2$ of the power components 2, 3.

The control component 4 can be driven via control bonding wires $21_7$, $21_8$ connected to external connections 22.

In this embodiment, the diameters of the control bonding wires 21 are 75 µm, the diameters of the power bonding wires 23', 24' are 350 µm, and the diameters of the power bonding wires 23, 24 are 500 µm.

Further aspects of the invention will be explained in the following description.

In power semiconductors for the most part nowadays the electric currents are transported by means of bonding wires made of aluminium, since this material permits very thick bonding wires (approximately 500 µm) reliably and cost-effectively. Nevertheless, in addition to the power components, IC components also have to be wired within a device, in which case only small currents have to be transported here. This gives rise to different bonding wire thicknesses for different current intensities within a device, in some instances identical potentials having to be wired (FIG. 1). The wiring of the individual components in the device is associated with a considerable space requirement that is minimized according to the invention.

In order to realize the wiring of the individual components in the device, it is necessary to provide special contact areas for the bonding wires on the individual chips. These contact areas are in some instances at the expense of the active structures within the chips and thus have to be compensated for by enlarging the chip areas. This then leads to higher costs and/or lower electrical performance per chip area.

According to one embodiment of the invention, in order to reduce the wire bonding contact areas on the chips or chip carriers, the surface of thick bonding wires already present is utilized as a wire bonding pad for thinner bonding wires. As a result of this, when wiring identical potentials, it is possible to save the contact area for thin bonding wires and thus to increase the integration density.

According to one embodiment of the invention, then, aluminium contacts (wedges) of thick bonding wires on chips or chip carriers are utilized as wire bonding pads for one or more thinner bonding wires having an identical potential.

The arrangement of a plurality of bonding wires arranged one above the other in part on a chip front side or a mounting connection is described for gold bonding wires in references 1)-5). In this embodiment, however, only thin bonding wires (approximately 50 µm) having identical thicknesses for small currents (approximately 2 A) are arranged one above the other. This is not expedient for large currents that occur in a semiconductor device according to the invention (for example 50 A), since this would then necessitate arranging a very large number (approximately 25) of bonding wires one next to the other and/or one above the other. The large currents can be transported reliably, however, by means of individual thick bonding wires (approximately 500 µm) and then afford the possibility, on the wedge, of arranging individual or a plurality of thinner bonding wires one next to the other and/or one above the other (FIGS. 2 and 3).

FIG. 3 illustrates a base chip comprising two MOSFETs 2, 3 controlled by means of an IC top chip 4. The two left-hand pins S1 are at source potential of the left-hand MOSFET 2, the pins S1 carrying bonding wires having different thicknesses. The IC top chip can be driven externally via the pins IC. The two right-hand pins S2 are at source potential of the right-hand MOSFET 3. This arrangement makes it possible to reduce the bonding pads for the source contacts (power contact areas) to a width of 500 µm, for example, even though bonding wires having widths of 360 µm and 75 µm have additionally been used.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power semiconductor device comprising:
a plurality of device components, including at least one power component and at least one integrated circuit control component for controlling the power component, that are contact connected by bonding wires having different thicknesses, the power components being contact-connected by power bonding wires and the integrated circuit control components being contact-connected by control bonding wires, Wherein at least one power bonding wire has a dimension selected to provide the at least one power bonding wire with a surface which serves as a contact area for at least one control bonding wire contact connected thereon, the at least one power bonding wire being thicker than the at least one control bonding wire contact-connected thereon, and wherein the selected dimension results in the at least one power bonding wire having a current carrying capacity in excess of a capacity required by a power component to which the at least one power bonding wire is contact-connected.

2. The power semiconductor device of claim 1, comprising wherein the diameter of the power bonding wires lies in a range of 350 µm to 500 µm.

3. The power semiconductor device of claims 1, comprising wherein the diameter of the control bonding wires is approximately 50 µm.

4. The power semiconductor device of claim 1, comprising wherein the thicker bonding wire sewing as contact area is contact-connected by the thinner bonding wire within a bonding wire region bearing on the device component that is contact-connected by the thicker bonding wire.

5. The power semiconductor device of claim 1, comprising wherein the power components are power MOSFET chips, and the control components are control chips.

6. A power semiconductor device, comprising:
   at least one power component; and
   at least integrated circuit control component for controlling the power components, the power components being contact-connected by power bonding wires, and the integrated circuit control components being contact-connected by control bonding wires, wherein the at least one power bonding wire has a diameter selected so as to provide the at least one power bonding wire with a surface which serves as a contact area for a control bonding wire contact-connected thereon, wherein the power bonding wire is of a diameter greater than the control bonding wire, and wherein the selected diameter results in the at least one power bonding wire having a current carrying capacity in excess of a capacity required by a power component to the at least one power bonding wire is contact-connected.

7. The power semiconductor device of claim 6, comprising wherein the diameter of the power bonding wires lies in a range of 350 μm to 500 μm.

8. The power semiconductor device of claims 6, comprising wherein the diameter of the control bonding wires is approximately 50 μm.

9. The power semiconductor device of claim 6, comprising wherein the thicker bonding wire serving as contact area is contact-connected by the thinner bonding wire within a bonding wire region bearing on the device component that is contact-connected by the thicker bonding wire.

10. The power semiconductor device of claim 6, comprising wherein the power components are power MOSFET chips, and the control components are control chips.

11. A power semiconductor device comprising:
    a plurality of device components that are contact-connected by bonding wires having different thicknesses, configured such that a surface of at least one bonding wire serves as a contact area for at least one further bonding wire, the bonding wire that serves as contact area being thicker than the bonding wire contact-connected thereon, including:
    at least one power component; and
    at least one integrated circuit control component for controlling the power components, the power components being contact-connected by power bonding wires, and the integrated circuit control components being contact-connected by control bonding wires, and wherein at least one power bonding wire has a dimension selected to provide the at least one power bonding wire with a surface which serves as a contact area for a control bonding wire contact-connected thereon, wherein the power bonding wire is thicker than the control bonding wire, and wherein the selected dimension results in the at least one power bonding wire having a current carrying capacity in excess of a capacity required by a power component to which the at least one power bonding wire is contact-connected.

12. The power semiconductor device of claim 11, comprising wherein the diameter of the power bonding wires lies in a range of 350 μm to 500 μm, and wherein the diameter of the control bonding wires is approximately 50 μm.

13. The power semiconductor device of claim 11, comprising wherein the thicker bonding wire serving as contact area is contact-connected by the thinner bonding wire within a bonding wire region bearing on the device component that is contact-connected by the thicker bonding wire, and wherein the power components are power MOSFET chips, and the control components are control chips.

14. The power semiconductor device of claim 1, wherein the excess current carrying capacity of the at least one power bonding wire enables power of the power component to be increased without increasing dimensions of the power component.

* * * * *